(12) United States Patent
Liu (10) Patent No.: US 8,553,451 B2
(45) Date of Patent: Oct. 8, 2013

(54) SPIN-TORQUE TRANSFER MEMORY CELL STRUCTURES WITH SYMMETRIC SWITCHING AND SINGLE DIRECTION PROGRAMMING

(75) Inventor: Jun Liu, Bose, ID (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 13/168,530

(22) Filed: Jun. 24, 2011

(65) Prior Publication Data

US 2012/0327706 A1 Dec. 27, 2012

(51) Int. Cl.
*G11C 11/00* (2006.01)

(52) U.S. Cl.
USPC ............... 365/158; 365/66; 365/97; 365/130; 365/131; 365/162; 365/170; 365/171; 365/173; 365/225.5

(58) Field of Classification Search
USPC ............. 365/66, 97, 130, 131, 158, 162, 170, 365/171, 173, 225.5
See application file for complete search history.

(56) References Cited

U.S. PATENT DOCUMENTS

| | | | |
|---|---|---|---|
| 6,980,469 B2 | 12/2005 | Kent et al. | |
| 6,992,359 B2 | 1/2006 | Nguyen et al. | |
| 7,230,845 B1 * | 6/2007 | Wang et al. | 365/173 |
| 7,430,135 B2 | 9/2008 | Huai et al. | |
| 7,626,857 B2 | 12/2009 | Shin et al. | |
| 7,682,841 B2 | 3/2010 | Dahmani et al. | |
| 7,881,104 B2 | 2/2011 | Lu et al. | |
| 7,916,433 B2 | 3/2011 | Huai et al. | |
| 8,305,801 B2 * | 11/2012 | Daibou et al. | 365/171 |
| 2011/0188298 A1 * | 8/2011 | Suzuki et al. | 365/158 |

* cited by examiner

*Primary Examiner* — Fernando Hidalgo
(74) *Attorney, Agent, or Firm* — Fletcher Yoder

(57) ABSTRACT

Techniques are provided for programming a spin torque transfer magnetic random access memory (STT-MRAM) cell using a unidirectional and/or symmetrical programming current. A unidirectional programming current flows through the free region of the STT-MRAM cell in one direction to switch the magnetization of the free region in at least two different directions. A symmetrical programming current switches the magnetization of the free region to either of the two different directions using a substantially similar current magnitude. In some embodiments, the STT-MRAM cell includes two fixed regions, each having fixed magnetizations in opposite directions and a free region configured to be switched in magnetization to be either parallel with or antiparallel to the magnetization of one of the fixed regions. Switching the free region to different magnetization directions may involve directing the programming current through one of the two oppositely magnetized fixed regions.

25 Claims, 6 Drawing Sheets

SPIN-TORQUE TRANSFER MEMORY CELL STRUCTURES WITH SYMMETRIC SWITCHING AND SINGLE DIRECTION PROGRAMMING

BACKGROUND

1. Field of Invention

Embodiments of the invention relate generally to memory, and more particularly, to STT-MRAM cells configured for symmetrical and unidirectional programming

2. Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Magnetic Random Access Memory (MRAM) is a non-volatile memory technology based on magnetoresistance. Unlike typical Random Access Memory (RAM) technologies which store data as electric charge, MRAM data is stored by magnetoresistive elements. Generally, the magnetoresistive elements in an MRAM cell are made from two magnetic regions, each of which holds a magnetization. The magnetization of one region (the "pinned region") is fixed in its magnetic orientation, and the magnetization of the other region (the "free region") can be changed by an external magnetic field generated by a programming current. Thus, the magnetic field of the programming current can cause the magnetic orientations of the two magnetic regions to be either parallel, giving a lower electrical resistance across the magnetoresistive elements ("0" state), or antiparallel, giving a higher electrical resistance across the magnetoresistive elements ("1" state) of the MRAM cell. The switching of the magnetic orientation of the free region and the resulting high or low resistance states across the magnetoresistive elements provide for the write and read operations of the typical MRAM cell.

A spin torque transfer MRAM (STT-MRAM) cell is another type of memory cell which is programmed by changing the magnetization of magnetoresistive elements. The STT-MRAM cell is written by transmitting a programming current through a magnetic cell stack including a free region and a pinned region. The programming current is polarized by the pinned region. The spin-polarized current then exerts the torque on the free region, switching the magnetization of the free region. The magnetization of the free region can be aligned to be either parallel or antiparallel to the pinned region, and the resistance state across the stack is changed.

Typically, a bidirectional programming current is used to change the free region magnetization from parallel to antiparallel and from antiparallel to parallel with the magnetization of the fixed region. To change the free region magnetization from parallel to antiparallel to that of the fixed region, electrons flow from the free region to the fixed region, and reflected electrons from the fixed region having opposite spins to the magnetization of the fixed region are used to switch the magnetization of the free region. Less electrons having an opposite spin to the magnetization of the fixed region may be reflected from the fixed region compared to electrons which are spin-polarized as they flow through the fixed region. Therefore, changing the free region magnetization from parallel to antiparallel with the magnetization of the fixed region generally uses a greater programming current (e.g., to have a greater number of reflected electrons having an opposite spin to the magnetization of the fixed region) than changing the free region magnetization from antiparallel to parallel with the magnetization of the fixed region. Such asymmetry in cell programming may result in various inefficiencies in manufacturing and/or operating an STT-MRAM cell.

BRIEF DESCRIPTION OF DRAWINGS

Certain embodiments are described in the following detailed description and in reference to the drawings in which.

DETAILED DESCRIPTION

A magnetic memory cell is typically programmed by changing a magnetic resistance in the cell. For example, a magnetic memory cell, referred to herein as a cell, may include regions of magnetic materials. During programming, one magnetic region of the cell, referred to as the "free region," may be switched in magnetization, and another magnetic region, referred to as the "pinned region," may remain fixed in magnetization. Typically, the free region magnetization may be switched between two opposite directions to be either parallel or antiparallel to the pinned region magnetization. When the magnetizations of the free and pinned regions are parallel, the resistance across the regions may be low, and when the magnetizations of the free and pinned regions are antiparallel, the resistance across the regions may be high. Thus, a magnetic memory cell may be programmed to either a low or a high resistance state by switching the magnetization of the free region.

Figure 1:
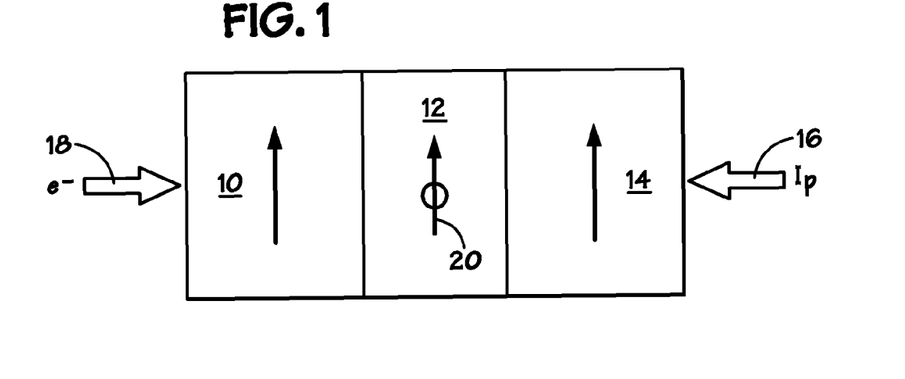
FIG. 1 is an illustration of an STT-MRAM cell structure having a free region programmed to have a magnetization parallel to that of a fixed region.
Figure 2:
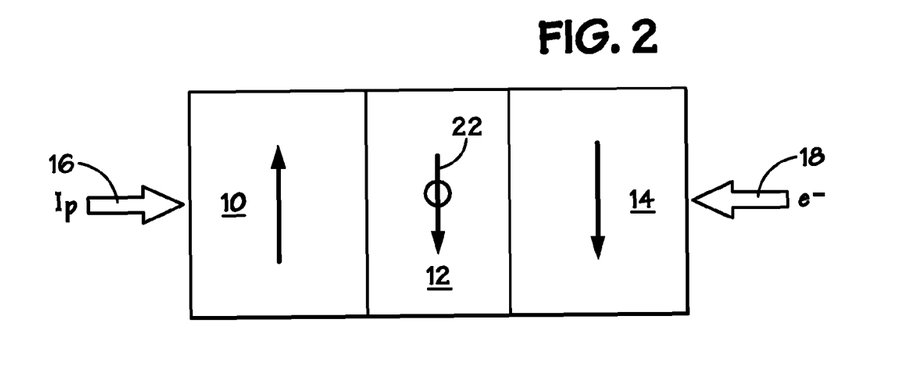
FIG. 2 is an illustration of an STT-MRAM cell structure having a free region programmed to have a magnetization antiparallel to that of a fixed region.

One example of such a magnetic memory cell is a spin torque transfer magnetic random access memory (STT-MRAM) cell. Programming a programmable structure of the STT-MRAM cell, referred to as a cell structure, is represented in FIGS. 1 and 2. FIG. 1 is an illustration of a cell structure programmed to a first state, where the magnetizations of the free region 14 and the fixed region 10 are parallel, and FIG. 2 is an illustration of a cell structure programmed to a second state, where the magnetizations of the free region 14 and the fixed region 10 are antiparallel.

Typically, programming a cell structure such as that illustrated in FIGS. 1 and 2 utilize a bidirectional programming current. A bidirectional programming current may refer to a programming current which is applied through the free layer 14 in a first direction to switch the magnetization of the free layer 14 to a first direction (e.g., to be parallel with the magnetization of the fixed layer 10) and applied through the free layer 14 in a second (e.g., opposite) direction to switch the magnetization of the free layer 14 to a second state (e.g., to be antiparallel with the magnetization of the fixed layer 10).

More specifically, as illustrated in FIG. 1, the programming current $I_p$ 16 is applied from a right side of the free region 14. The electrons 18 of the programming current 16 may propagate in an opposite direction from the direction of the programming current 16 (i.e., from a left side of the free region 14). The electrons 18 which pass through the fixed region 10 are spin polarized to have the spin polarity of the fixed region 10, as represented by the upward pointing arrow 20. The electrons 18 having the spin polarity 20 of the fixed region 10 may propagate through the nonmagnetic region 12 to switch the magnetization of the free region 14 to have a magnetization that is parallel (as represented by the upward pointing arrow in the free region 14) to the magnetization of the fixed region 10, thereby programming the cell to a first state.

To program a cell to a second state, the programming current 16 may be applied from a left side of the free region 14, as illustrated in FIG. 2. The electrons 18 of the programming current 16 may propagate in an opposite direction from the direction of the programming current 16 (i.e., from a right side of the free region 14). The electrons 18 may pass through the free region 14 and the nonmagnetic region 12. As the free region 14 and nonmagnetic region 12 may not have a strong fixed polarity, the electrons 18 may still be substantially unpolarized before reaching the fixed region 10. Once the electrons 18 reach the fixed region 10, some of the electrons 18 may be spin polarized by the fixed region 10 and reflected from the fixed region 10. Reflected electrons 18 may have a reflected spin polarity 22 that is opposite from the spin polarity of the fixed region 10, as represented by the downward pointing arrow 22. The reflected electrons having the opposite spin polarity 22 of the fixed region 10 may propagate through the nonmagnetic region 12 to switch the magnetization of the free region 14 to have a magnetization that is antiparallel (as represented by the downward pointing arrow in the free region 14) to the magnetization of the fixed region 10, thereby programming the cell to the second state.

In such typical cell configurations as illustrated in FIGS. 1 and 2, and when using a programming current having the same magnitude, the amount of electrons 18 which are reflected by the fixed region 10 to have a spin polarization opposite to the magnetization of the fixed region 10 may be less than the amount of electrons 18 which propagate through the fixed region 10 to have a spin polarization of the fixed region 10. Therefore, a higher programming current may be utilized to switch the magnetization of the free region 14 from parallel to antiparallel with the magnetization of the fixed region 10 than the programming current utilized to switch the magnetization of the free region 14 from antiparallel to parallel with the magnetization of the fixed region 10.

Figure 3:
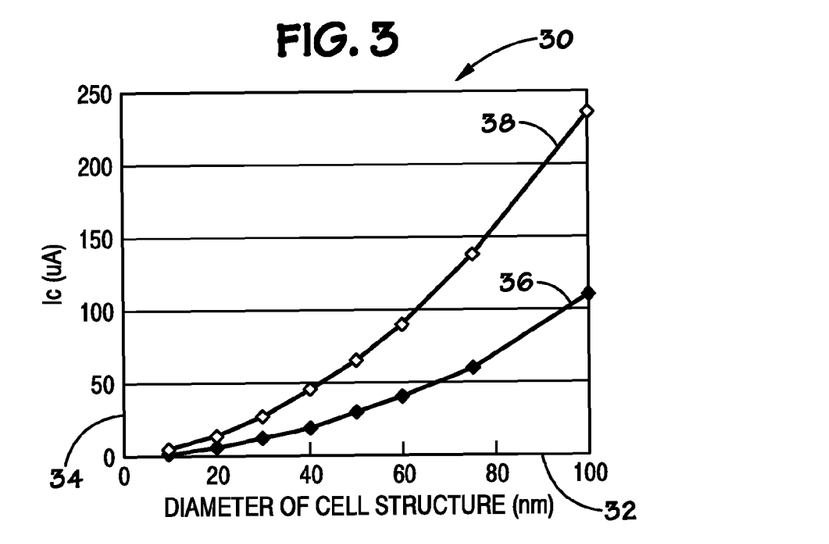
FIG. 3 is an illustration of a chart plotting estimated programming currents employed to switch a free region to have a magnetization parallel and antiparallel to that of a fixed region, as illustrated in FIGS. 1 and 2.

The graph 30 of FIG. 3 plots a range of programming current (in μA) 34 over a cell structure diameter range 32 (in nm) for switching a free region 14 magnetization from antiparallel to parallel to the magnetization of a fixed region 10, as indicated by plot 36 (referred to as switching to a first state), and the programming current for switching the free region 14 magnetization from parallel to antiparallel to the magnetization of a fixed region 10, as indicated by plot 38 (referred to as switching to a second state). As indicated by the graph 30, the programming current used for switching to the second state (plot 36) is significantly higher than the programming current used for switching to the first state (plot 36).

Operating an STT-MRAM cell using a bidirectional programming current and/or a higher current magnitude for programming a cell to the second state may attribute to various inefficiencies. Programming a cell with a bidirectional programming current may involve a sensing amplifier capable of bidirectional operation, which may be less efficient than circuitry used for single directional operation. Furthermore, circuitry capable of bidirectional operation may take more silicon space than circuitry used for single directional operation. Using a higher current magnitude for programming a cell to the second state (compared to programming the cell to the first state) is referred to as asymmetrical programming Asymmetrical programming may decrease the stability of the cell, as switching between applying high and low voltages through the free region may increase latency and disturbances to the free layer.

One or more embodiments of the present techniques include STT-MRAM cells having cell structures configured for symmetrical programming with a unidirectional programming current. A unidirectional programming current refers to programming an STT-MRAM cell structure by directing a programming current through a free region in one direction to switch the magnetization of the free region between two different directions. In some embodiments, a unidirectional programming current may be applied through the free layer in one direction to program the cell to a first state, and the unidirectional programming current may be applied through the free layer in the same direction to program the cell to a second state. Symmetrical programming refers to switching the magnetization of the free region to either of the two different directions using a substantially similar current magnitude.

Figure 4:
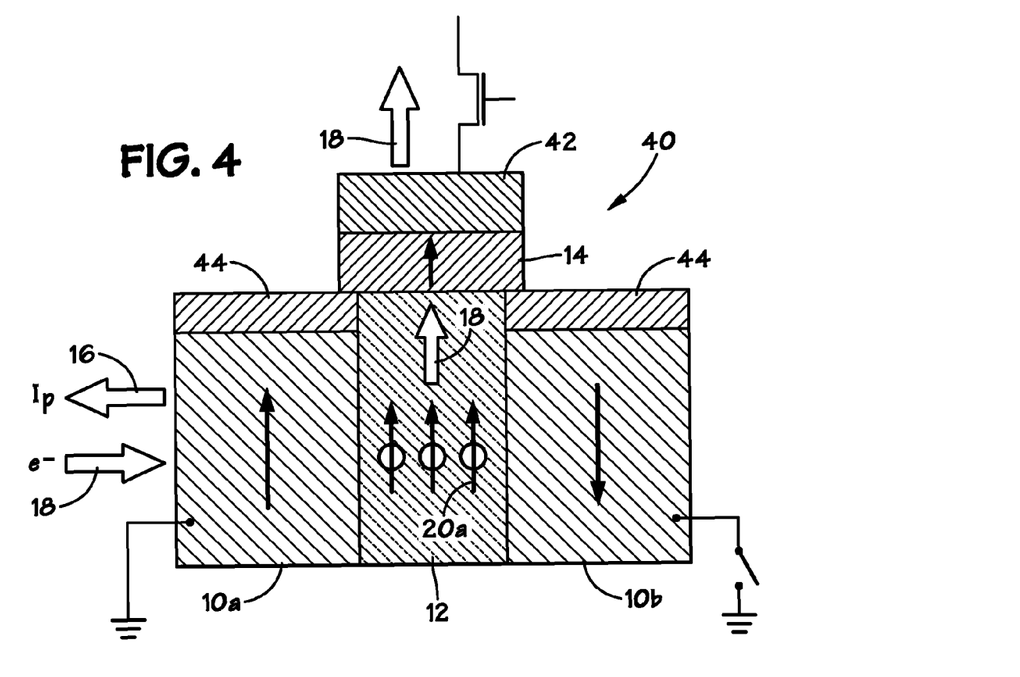
FIG. 4 is an illustration of an STT-MRAM cell structure configured for symmetrical programming which is programmed to have parallel magnetizations between the reference fixed and free regions, in accordance with embodiments of the present technique.
Figure 5:
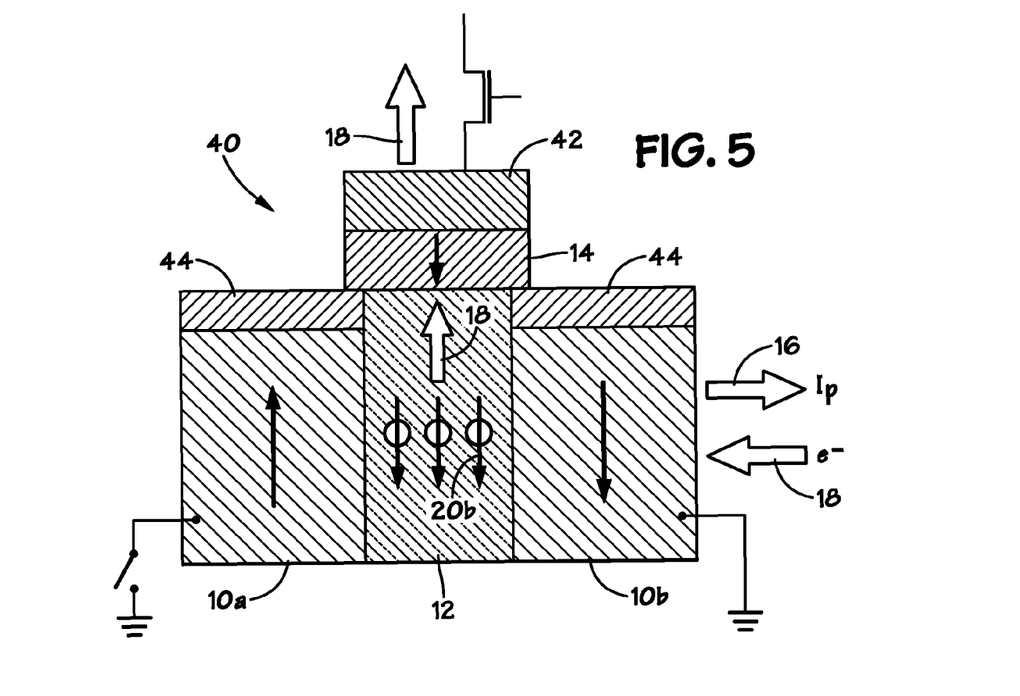
FIG. 5 is an illustration of an STT-MRAM cell structure configured for symmetrical programming which is programmed to have antiparallel magnetizations between the reference fixed and free regions, in accordance with embodiments of the present technique.

An embodiment of a STT-MRAM cell structure suitable for symmetrical, unidirectional programming is illustrated in FIGS. 4 and 5. FIG. 4 is an illustration of a cell structure 40 programmed to a first state, where the magnetization of the free region 14 is parallel with the magnetization of a reference fixed region 10a, and FIG. 5 is an illustration of a cell structure 40 programmed to a second state, where the magnetization of the free region 14 is antiparallel to the magnetization of a reference fixed region 10a. As used herein, a reference fixed region 10a may be used in describing embodiments having two fixed regions 10, where the programmed state of the STT-MRAM cell structure is determined by the resistance across the free region 14 and a particular reference fixed region 10a of the two fixed regions 10.

As illustrated in FIGS. 4 and 5, some embodiments may include two fixed regions 10a and 10b, each having a magnetization fixed to an opposite direction of the other, as represented by the oppositely pointing arrows in each of the fixed regions 10a and 10b. A nonmagnetic region 12 may be disposed between the two fixed regions 10a and 10b. In some embodiments, a free region 14 may be disposed over the nonmagnetic region 12, and a top electrode 42 may be disposed over the free region 14. A tunnel barrier may be disposed between the free region 14 and the nonmagnetic region 12 in some embodiments. Furthermore, the free region 14 may be separated from the fixed regions 10a and 10b by dielectric materials 44.

In some embodiments, the fixed regions 10a and 10b and the free region 14 may include the same or different materials. For example, each of the fixed and free regions 10 and 14 may include magnetic materials or ferromagnetic materials such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material such as $Fe_3O_4$, $CrO_2$, NiMnSb, PtMnSb, and BiFeO, or any combination of the above materials.

The nonmagnetic region 12 may be suitable for separating the fixed region 10a, the fixed region 10b, and the free region 14 from each other and suitable for substantially preventing coupling between the magnetizations of the fixed and free regions 10a, 10b, and 14. For example, the nonmagnetic region 12 may include conductive, nonmagnetic materials such as Cu, Au, Ta, Ag, CuPt, CuMn, nonconductive, non-magnetic materials such as $Al_xO_y$, $MgO_x$, $AlN_x$, $SiN_x$, $CaO_x$, $NiO_x$, $HfO_x$, $Ta_xO_y$, $ZrO_x$, $NiMnO_x$, $MgF_x$, SiC, $SiO_x$, $SiO_xN_y$, or any combination of the above materials.

In accordance with the present techniques, the cell structure 40 may be programmed with a unidirectional programming current. The unidirectional programming current may pass through the free region 14 in one direction to switch the magnetization of the free region 14 to be either parallel or antiparallel with the magnetization of one of the fixed regions 10a or 10b.

FIG. 4 is an illustration of programming the STT-MRAM cell structure 40 such that the free region 14 has a magnetization that is parallel with the reference fixed region 10a. In some embodiments, a programming current ($I_p$) 16 is applied in a direction from the free region 14 to the nonmagnetic region 12 to the fixed region 10a. The electrons 18 of the programming current 16 may propagate in an opposite direction from the direction of the programming current 16 from the fixed region 10a through the nonmagnetic region 12 through the free region 14 and to the top electrode 42. In some embodiments, the path of the electrons 18 may be controlled by biasing conductive leads of the fixed regions 10a and 10b and the top electrode 42, depending on the state in which the cell structure 40 is to be written. For example, to write the cell structure 40 to a first state, as illustrated in FIG. 4, the fixed region 10a may be grounded while the fixed region 10b is floating or biased at the same potential as the nonmagnetic region 12, such that the direction of the programming current 16 and the propagation of electrons 18 may flow between the fixed region 10a, the nonmagnetic region 12, and the free region 14 (and not through the fixed region 10b). In some embodiments, each of the fixed regions 10a and 10b may be coupled to a bottom electrode and/or a switch to ground to be grounded or biased depending on the programming state of the cell structure 40.

The electrons 18 which pass through the fixed region 10a are spin polarized to have the spin polarity of the fixed region 10a, which is represented by the upward pointing arrows. The electrons 18 having the spin polarity 20a of the fixed region 10a may propagate through the nonmagnetic region 12 towards the free region 14 to switch the magnetization of the free region 14 to have a magnetization that is parallel (as represented by the upward pointing arrow in the free region 14) to the magnetization of the reference fixed region 10a, thereby programming the cell to a first state.

FIG. 5 is an illustration of programming the STT-MRAM cell structure 40 such that the free region 14 has a magnetization that is antiparallel with the reference fixed region 10a and parallel to the fixed region 10b. To program a cell to a second state, the programming current 16 may be applied in a direction from the free region 14 to the nonmagnetic region 12 to the fixed region 10b. The electrons 18 of the programming current 16 may propagate in an opposite direction from the direction of the programming current 16 from the fixed region 10b, through the nonmagnetic region 12, through the free region 14, and to the top electrode 42. In some embodiments, the fixed region 10b may be grounded while the fixed region 10a is floating or biased at the same potential as the nonmagnetic region 12, such that electrons 18 flow between the fixed region 10b, the nonmagnetic region 12, and the free region 14 (and not through the fixed region 10a).

The electrons 18 which pass through the fixed region 10b are spin polarized to have the spin polarity 20b of the fixed region 10b, which is represented by the downward pointing arrows. The electrons 18 having the spin polarity 20 of the fixed region 10b may propagate through the nonmagnetic region 12 towards the free region 14 to switch the magnetization of the free region 14 to have a magnetization that is antiparallel (as represented by the downward pointing arrow in the free region 14) to the magnetization of the reference fixed region 10a, thereby programming the cell to a second state.

In some embodiments, while the programming current 16 may be directed towards either of the fixed regions 10a or 10b depending on the programming state of the cell structure 40, a reading current may be directed towards only one of the fixed regions 10a or 10b, regardless of the programmed state of the cell structure 40. Therefore, the switched magnetization of the free region 14 may be read with respect to one fixed magnetization of either the fixed region 10a or the fixed region 10b. In the embodiments illustrated in FIGS. 4 and 5, the magnetization orientation of the free region 14 is read with respect to the fixed magnetization of the fixed region 10a. In different embodiments, the magnetization of the free region 14 may also be read with respect to a different fixed magnetization orientation (e.g., the magnetization of the fixed region 10b).

Figure 6:
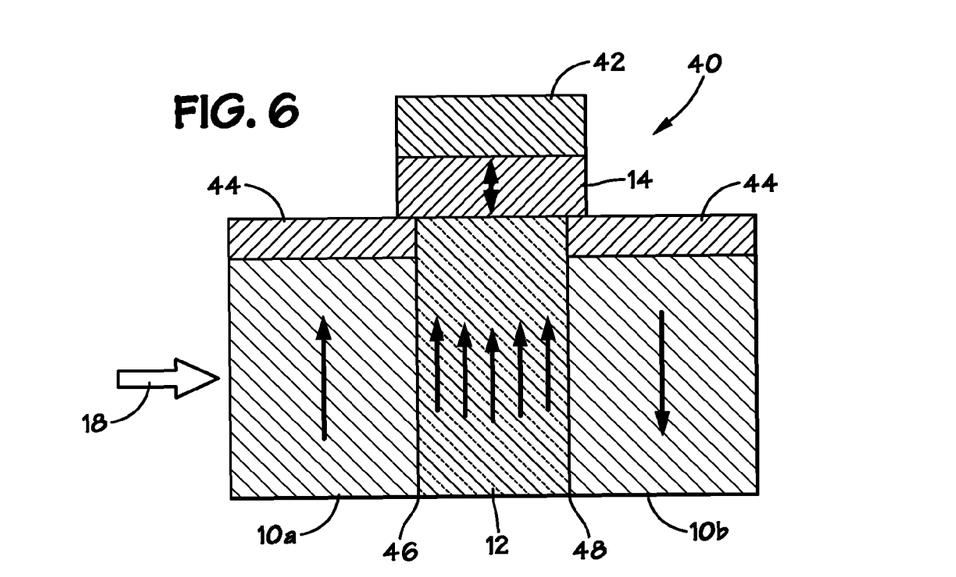
FIG. 6 is an illustration of an STT-MRAM cell structure configured for spin accumulation in a nonmagnetic region, in accordance with embodiments of the present technique.

One or more embodiments may also involve generating a spin filter effect in the nonmagnetic region 12 of the cell structure 40 during programming, as illustrated in FIG. 6. The spin filter effect may refer to a behavior of spin polarized electrons flowing across a ferromagnetic material and non-magnetic material interface and/or a behavior of spin polarized electrons reflecting from a nonmagnetic material and ferromagnetic material interface. As illustrated in FIG. 6, the electrons 18 may be propagating in a direction from the fixed region 10a through a ferromagnetic/nonmagnetic interface 46 to the nonmagnetic region 12. The electrons 18 may be spin polarized to the magnetization of the fixed region 10a, and the spin polarized electrons may accumulate in the non-magnetic region 12. The electrons 18 may also be reflected at the nonmagnetic/ferromagnetic interface 48 to be spin polarized to a direction opposite of the magnetization of the fixed region 10b. Therefore, the spin polarization of the electrons 18 reflected from the nonmagnetic/ferromagnetic interface 48 may also be spin polarized to the same direction as the electrons 18 spin polarized by the fixed region 10a. The accumulation of spin polarized electrons in the direction of the magnetization of the fixed region 10a (indicated by the upward pointing arrows in the nonmagnetic region 12 of FIG. 6) may further affect the switching of the free region 14. In some embodiments, the programming current 16 utilized for programming the free region 14 may be adjusted or reduced due to the spin filter effect in the nonmagnetic region 12.

A process for forming the cell structure 40 illustrated in FIGS. 4-6 is provided in FIGS. 7A-7J. The process steps are represented by side views from an x-direction (labeled 50x, 60x, 66x, 68x, and 72x) and corresponding side views from a y-direction (labeled 50y, 60y, 66y, 68y, and 72y) of intermediate structures in the formation of three STT-MRAM cell structures 40 in a dielectric material 58. The process represented in FIGS. 7A-7J illustrates side views of three cells in each of the x-direction (e.g., a view of a row of cell structures) and y-direction (e.g., a view of a column of cell structures) for simplification of the process, though any number of cells may be formed from the described process.

Figure 7A:
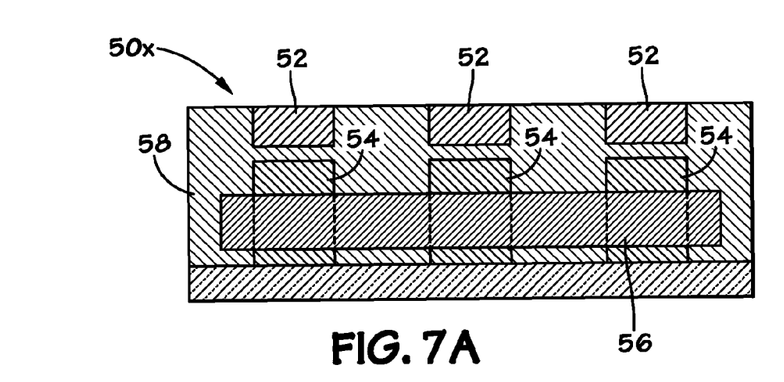
FIGS. 7A-7J are illustrations of a series of side views in an x-direction and in a y-direction of a technique for forming an STT-MRAM cell configured for symmetrical programming, in accordance with embodiments of the present technique.
Figure 7B:
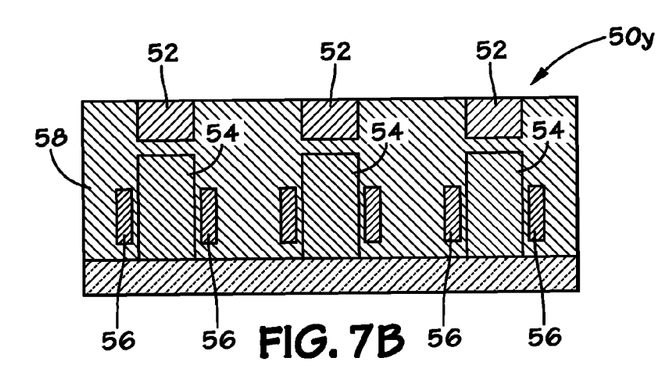
Figure 7C:
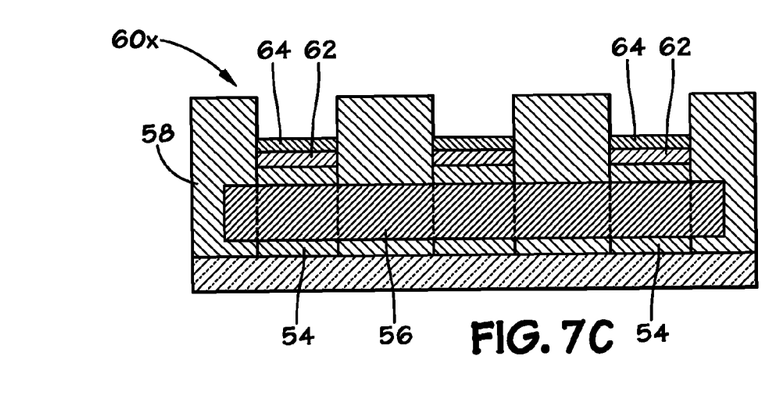
Figure 7D:
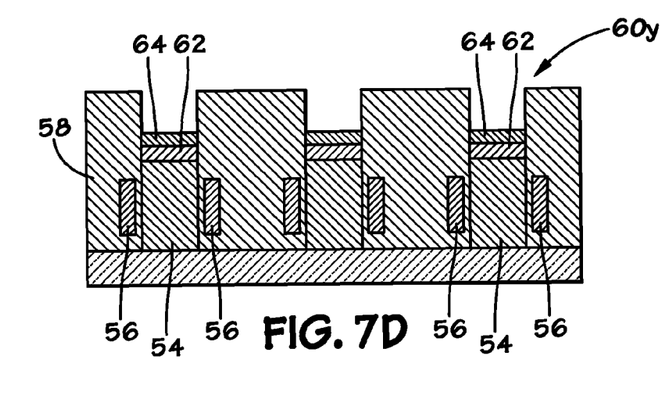

The process begins with forming transistors 54 and side gates 56 in the substrate 58, as illustrated in views 50x and 50y (FIGS. 7A and 7B). The substrate 58 may include dielectric material (and may also be referred to as the dielectric 58) or any other suitable material for separating different cell structures. In one embodiment, a photolithography and dry etch process may be used to recess the substrate 58. A suitable metal such as titanium nitride (TiN) may be used to form the side gates 56 in the recess, and P-doped silicon 54 may be deposited or formed between two side gates 56, as illustrated in view 50y, to form the transistors 54 in the recesses of the substrate 58. In some embodiments, a sacrificial material 52 such as silicon nitride (SiN) may be used as an etch mask for forming the structures illustrated in views 50x and 50y. As illustrated in FIGS. 7C and 7D, the process may then involve removing the sacrificial material 52 and depositing or forming N-doped silicon 62 over the transistors 54 and depositing or forming a conductive material 64 (e.g., $CoSi_2$ or any other suitable metallic, conductive material) over the N-doped silicon 62, as illustrated in views 60x and 60y. The N-doped silicon 62 and conductive material 64 may form the drains of the vertical transistor 54.

Figure 7E:
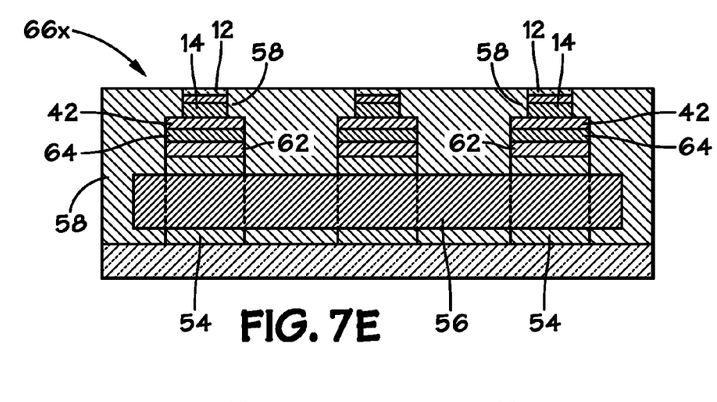
Figure 7F:
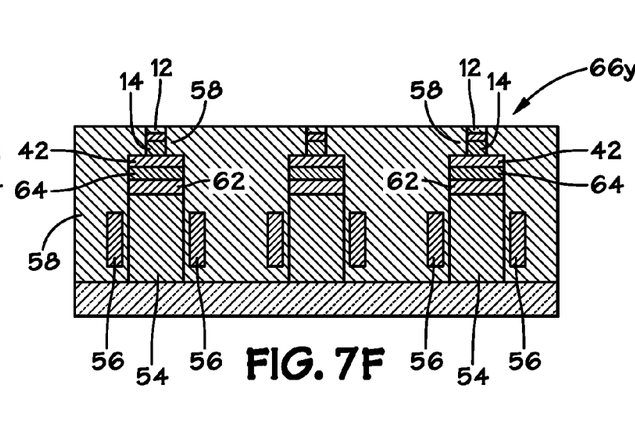

A top electrode 42 may be formed over the conductive material 64, as illustrated in views 66x and 66y of FIGS. 7E and 7F. The top electrode 42 may be formed by depositing a suitable conductive metal such as TiN, W, etc. In some embodiments, the dielectric 58 may be deposited along sidewalls of the recess over the top electrode 42. The dielectric 58 may function as a spacer to reduce the diameter of materials deposited within the inner perimeter of the dielectric 58. As illustrated in views 66x and 66y the free region 14 may be formed over the top electrode 42 and within the spacer formed by the dielectric 58, and nonmagnetic materials 12 may be deposited over the free region 14.

Figure 7G:
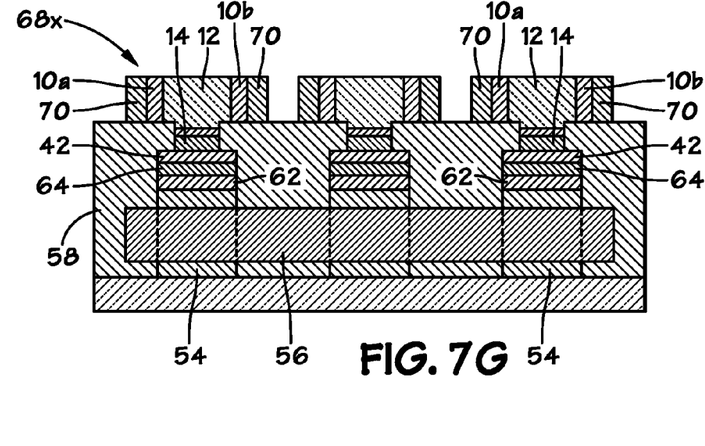
Figure 7H:
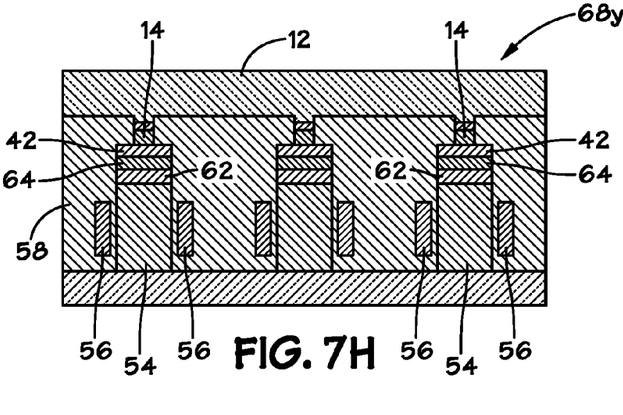
Figure 7I:
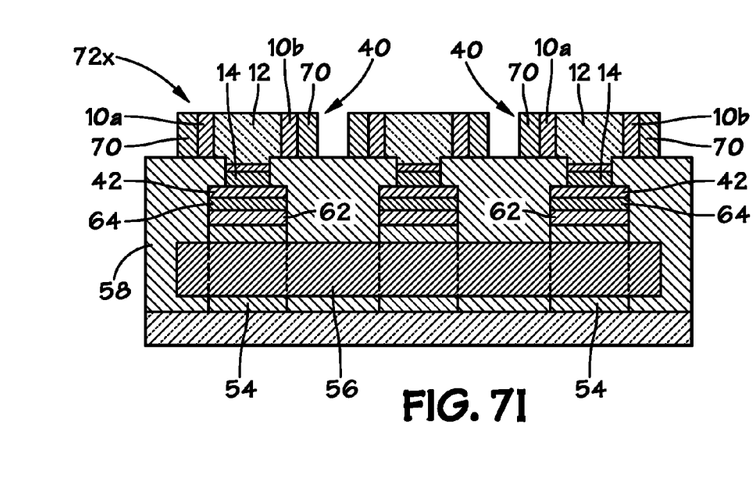
Figure 7J:
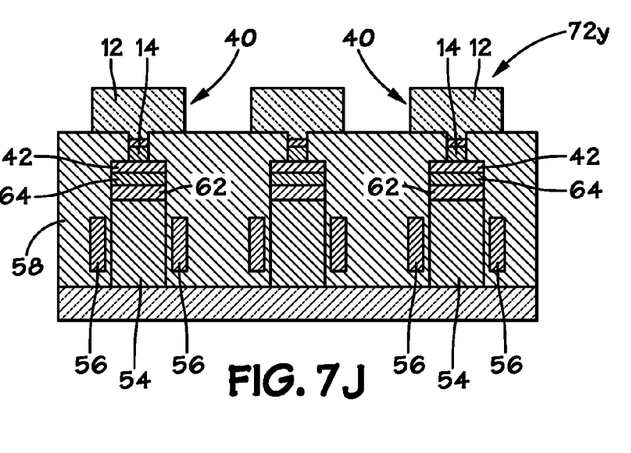

As illustrated in FIGS. 7G and 7H, the process may then involve forming a nonmagnetic region 12 over each cell structure. The nonmagnetic regions 12 may be formed by depositing nonmagnetic materials and patterning the nonmagnetic materials in lines, such that a line of the nonmagnetic region 12 is formed over a row of cell structures, as illustrated in view 68y. As illustrated in view 68x, fixed regions 10a and 10b may be formed on either side of the nonmagnetic region 12 for each cell structure, and a metal strap 70 may be formed on an opposite side of each of the fixed regions 10a and 10b. The ferromagnetic materials of the fixed regions 10a and 10b may be formed by conformal deposition and may be followed by a spacer etch or spacer formation process. Furthermore, the metal strap 70 may be configured to lower the resistance of the fixed regions 10a and 10b and may include a suitable conductive metal (e.g., TiN, W, etc.). The metal strap 70 may also be deposited conformally over the fixed regions 10a and 10b and may be followed by a spacer formation process. The row of nonmagnetic regions 12 may then be patterned by cross-line patterning to form individual cell structures 40, as illustrated in views 72x and 72y of FIGS. 7I and 7J.

Figure 8:
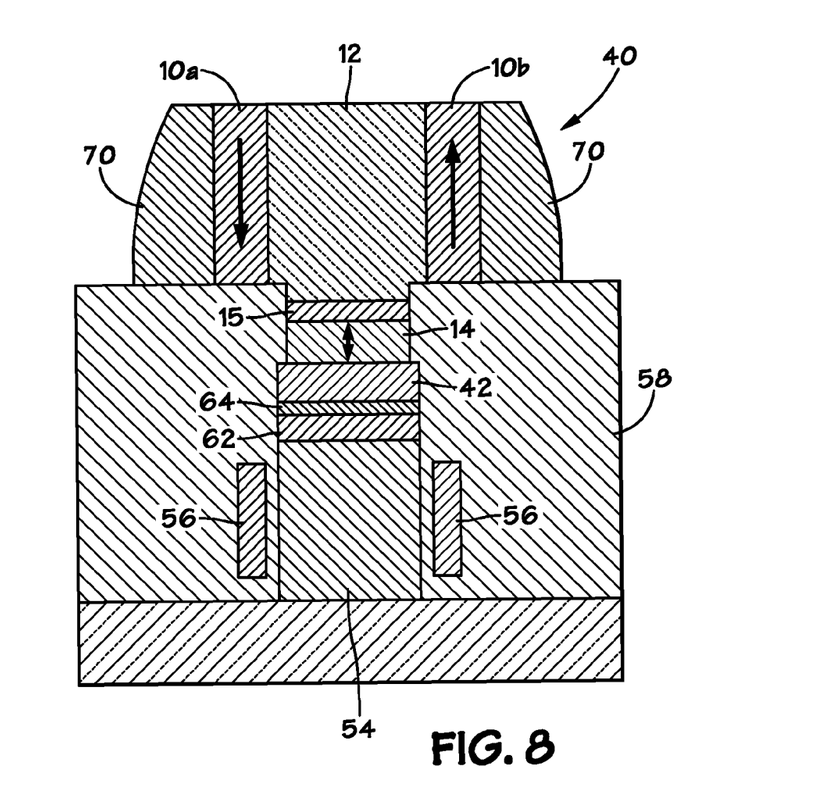
FIG. 8 is an illustration of an STT-MRAM cell structure formed using the techniques represented in FIGS. 7A-7E, in accordance with embodiments of the present technique.

FIG. 8 is an illustration of a larger view of an STT-MRAM cell structure 40 created by the process illustrated in FIGS. 7A-7J. FIGS. 4-6 and FIG. 8 include one or more embodiments of an STT-MRAM cell structure suitable for symmetrical programming and/or programming with a unidirectional programming current. FIGS. 7A-7J include one or more embodiments of forming the cell structures 40. In accordance with the present techniques, embodiments may include other configurations of cell structures 40 which may be suitable for symmetrical programming and/or unidirectional programming Moreover, embodiments also include variations of the process illustrated in FIGS. 7A-7J. For instance, various types of masking, etching, and/or deposition techniques may be suitable for forming different regions of the cell structure 40 in accordance with the present techniques.

It should be noted that while the embodiments illustrated in FIGS. 4-6 and 8 depict a magnetization orientation as pointing in a z-direction with respect to the page (e.g., the upward pointing and downward pointing arrows), the present techniques are not limited to any particular magnetization orientation. In some embodiments, the magnetization orientation of the free region 14 and fixed regions 10a and 10b may be in a different direction (e.g., in an x-direction or y-direction) compared to the depicted magnetization orientations in FIGS. 4-6 and 8. In such embodiments, the free region 14 magnetization orientation may correspond to the magnetization orientations of the fixed regions 10a and 10b and programmed to be parallel or antiparallel to the fixed regions 10a or 10b, indicating different programmed states of the memory cell.

As used herein, when describing the configuration of the cell structure 40 and/or techniques for forming the cell structure 40 (e.g., FIGS. 7A-7J), terms such as "over," "under," "formed over," "formed below," "disposed over," or "disposed below" refer to only one possible orientation of the described structure or process and do not limit the present embodiments to any particular orientation. For instance, the cell structure 40 illustrated in FIGS. 4-6 may have a flipped orientation (e.g., along the x-direction) compared to the cell structure 40 illustrated in FIG. 8.

Furthermore, as used herein, when a region is said to be "formed over," "formed below," "disposed over," "disposed below," or "disposed" another region, there may be intervening regions formed or disposed between those regions. For example, in some embodiments, the free region 14 may be disposed over the nonmagnetic region 12, and a tunnel barrier 15 may be disposed between the free region 14 and the nonmagnetic region 12. Conversely, if a layer or material is said to be "formed directly on," "formed directly below," "disposed directly on," "disposed directly below," "disposed directly along," "in direct contact with," or "touching," the materials or layers include no intervening materials or layers therebetween.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A spin torque transfer magnetic random access memory (STT-MRAM) cell structure, comprising:
   a nonmagnetic region having at least a first side, a second side, and a third side;

a first region with a fixed magnetization orientation disposed in direct contact with the first side of the nonmagnetic region;

a second region with a fixed magnetization orientation disposed in direct contact with the second side of the nonmagnetic region; and a region with a free magnetization orientation disposed along the third side of the nonmagnetic region.

2. The STT-MRAM cell structure of claim 1, wherein none of the region with a free magnetization orientation, the first region with a fixed magnetization orientation, or the second region with a fixed magnetization orientation are in direct contact with one another.

3. The STT-MRAM cell structure of claim 1, comprising a top electrode disposed along the region with a free magnetization orientation opposite the nonmagnetic region.

4. A spin torque transfer magnetic random access memory (STT-MRAM) cell structure, comprising:

a nonmagnetic region having at least a first side, a second side, and a third side;

a first region with a fixed magnetization orientation disposed along the first side of the nonmagnetic region;

a second region with a fixed magnetization orientation disposed along the second side of the nonmagnetic region; and a region with a free magnetization orientation disposed along the third side of the nonmagnetic region, wherein the first region with a fixed magnetization orientation is configured to be grounded such that a programming current through the region with a free magnetization orientation to the nonmagnetic region and to the first region with a fixed magnetization orientation results in electrons propagating from the first region with a fixed magnetization orientation, through the nonmagnetic region, and through the region with a free magnetization orientation to switch a magnetization of the region to be parallel with a magnetization of the first region with a fixed magnetization orientation.

5. The STT-MRAM cell structure of claim 4, wherein the second region with a fixed magnetization orientation is configured to be grounded such that a programming current driven through the region with a free magnetization orientation to the nonmagnetic region and to the second region with a fixed magnetization orientation results in electrons propagating from the second region with a fixed magnetization orientation, through the nonmagnetic region, and through the region with a free magnetization orientation to switch a magnetization of the region with a free magnetization orientation to be antiparallel with a magnetization of the first region with a fixed magnetization orientation.

6. The STT-MRAM cell structure of claim 1, comprising a tunnel barrier disposed between the region with a free magnetization orientation and the nonmagnetic region.

7. A spin torque transfer magnetic random access memory (STT-MRAM) cell structure, comprising:

a nonmagnetic region having at least a first side, a second side, and a third side;

a first region with a fixed magnetization orientation disposed along the first side of the nonmagnetic region;

a second region with a fixed magnetization orientation disposed along the second side of the nonmagnetic region; and a region with a free magnetization orientation disposed along the third side of the nonmagnetic region;

a first interface where the first region with a fixed magnetization orientation contacts the nonmagnetic region, wherein electrons passing from the first region with a fixed magnetization orientation through the first interface accumulate in the nonmagnetic region, wherein the passing electrons are spin polarized to a magnetization of the first region with a fixed magnetization orientation; and a second interface where the second region with a fixed magnetization orientation contacts the nonmagnetic region, wherein electrons reflecting from the second region with a fixed magnetization orientation into the nonmagnetic region accumulate in the nonmagnetic region, wherein the reflecting electrons are spin polarized to a magnetization opposite of the second region with a fixed magnetization orientation, and wherein the passing electrons and the reflecting electrons are spin polarized to a substantially similar direction.

8. A spin torque transfer magnetic random access memory (STT-MRAM) cell configured to be programmed by a unidirectional programming current, wherein the STT-MRAM cell comprises:

a first region with a fixed magnetization orientation having a magnetization in a first direction;

a second region with a fixed magnetization orientation having a magnetization in a second direction;

a nonmagnetic region between the first region with a fixed magnetization orientation and the second region with a fixed magnetization orientation; and a region with a free magnetization orientation disposed over the nonmagnetic region, wherein the region with a free magnetization orientation is configured to be switched in magnetization by a unidirectional programming current to have a magnetization that is either parallel with or antiparallel to the magnetization of the first region with a fixed magnetization orientation.

9. The STT-MRAM cell of claim 8, comprising a top electrode disposed over the region with a free magnetization orientation on an opposite side of the region with a free magnetization orientation from the nonmagnetic region.

10. The STT-MRAM cell of claim 9, comprising a transistor disposed over the top electrode.

11. The STT-MRAM cell of claim 8, wherein the first region with a fixed magnetization orientation is grounded and the second region with a fixed magnetization orientation is floating in a first configuration, and the second region is grounded and the first region with a fixed magnetization orientation is floating in a second configuration.

12. The STT-MRAM cell of claim 8, wherein the region with a free magnetization orientation is configured to be switched in magnetization when a programming current flows from a first side of the region with a free magnetization orientation to a second side of the region with a free magnetization orientation, wherein the second side of the region with a free magnetization orientation is adjacent to the nonmagnetic region.

13. A spin torque transfer magnetic random access memory (STT-MRAM) cell configured for symmetrical programming, wherein the STT-MRAM cell comprises:

a first region with a fixed magnetization orientation having a first magnetization;

a second region with a fixed magnetization orientation having a second magnetization;

a nonmagnetic region disposed between the first region with a fixed magnetization orientation and the second region with a fixed magnetization orientation; and a region with a free magnetization orientation disposed over the nonmagnetic region, wherein the region with a free magnetization orientation is configured to be switched by a first programming current to have the first magnetization or switched by a second programming current to have the second magnetization, wherein a magnitude of the first programming current is substantially similar to a magnitude of the second programming current.

14. The STT-MRAM cell of claim 13, wherein the first region with a fixed magnetization orientation, the second region with a fixed magnetization orientation, and the region with a free magnetization orientation are not touching.

15. The STT-MRAM cell of claim 13, wherein the first region with a fixed magnetization orientation, the second region with a fixed magnetization orientation, and the region with a free magnetization orientation each comprise Co, Fe, Ni or its alloys, NiFe, CoFe, CoNiFe, CoX, CoFeX, CoNiFeX (X=B, Cu, Re, Ru, Rh, Hf, Pd, Pt, C), $Fe_3O_4$, $CrO_2$, NiMnSb and PtMnSb, BiFeO, or any combination of the above materials.

16. The STT-MRAM cell of claim 13, wherein the nonmagnetic region comprises Cu, Au, Ta, Ag, CuPt, CuMn, $Al_xO_y$, $MgO_x$, $AlN_x$, $SiN_x$, $CaO_x$, $NiO_x$, $HfO_x$, $Ta_xO_y$, $ZrO_x$, $NiMnO_x$, $MgF_x$, SiC, $SiO_x$, $SiO_xN_y$, or any combination of the above materials.

17. The STT-MRAM cell of claim 13, wherein the nonmagnetic region is configured to transfer a spin filter effect to the region with a free magnetization orientation.

18. The STT-MRAM cell of claim 13, wherein the first programming current and the second programming current are both unidirectional programming currents which propagate through the region with a free magnetization orientation in one direction.

19. A method of operating a spin torque transfer magnetic random access memory (STT-MRAM) cell, the method comprising:
    directing a first programming current to program the STT-MRAM cell in a first state, wherein the first programming current is directed through a region with a free magnetization orientation and through a second region with a fixed magnetization orientation having a second magnetization, such that electrons flowing from the second region with a fixed magnetization orientation are spin polarized to the second magnetization and switch a magnetization of the region with a free magnetization orientation to the second magnetization; and
    directing a second programming current to program the STT-MRAM cell in a second state, wherein the second programming current is directed through the region with a free magnetization orientation and through a first region with a fixed magnetization orientation having a first magnetization, such that electrons flowing from the first region with a fixed magnetization orientation are spin polarized to the first magnetization and switch the magnetization of the region with a free magnetization orientation to the first magnetization, wherein the first programming current and the second programming current have a substantially similar magnitude and pass through the region with a free magnetization orientation in the same direction.

20. The method of operating the STT-MRAM cell of claim 19, comprising generating a spin filter effect in a nonmagnetic region between the first region with a fixed magnetization orientation and the second region with a fixed magnetization orientation, wherein the spin filter effect contributes to switching the magnetization of the region with a free magnetization orientation to either the first magnetization or the second magnetization.

21. The method of operating the STT-MRAM cell of claim 19, wherein switching the magnetization of the region with a free magnetization orientation to the first magnetization programs the STT-MRAM cell to a first memory state and switching the magnetization of the region with a free magnetization orientation to the second magnetization programs the STT-MRAM cell to a second memory state.

22. A method for forming a cell structure, the method comprising:
    forming a recess in a substrate;
    forming a transistor in the recess;
    forming a region with a free magnetization orientation in the recess and over the transistor;
    forming a nonmagnetic region over the region with a free magnetization orientation, such that the region with a free magnetization orientation contacts a first side of the nonmagnetic region; and
    forming a first region with a fixed magnetization orientation and a second region with a fixed magnetization orientation, such that the first region with a fixed magnetization orientation directly contacts a second side of the nonmagnetic region and the second region with a fixed magnetization orientation directly contacts a third side of the nonmagnetic region, wherein none of the region with a free magnetization orientation, the first region with a fixed magnetization orientation, or the second region with a fixed magnetization orientation are touching.

23. The method of claim 22, comprising forming a top electrode over the transistor and forming the region with a free magnetization orientation over the top electrode.

24. A method for forming a cell structure, the method comprising:
    forming a recess in a substrate;
    forming a transistor in the recess;
    forming a region with a free magnetization orientation in the recess and over the transistor;
    forming a nonmagnetic region over the region with a free magnetization orientation, such that the region with a free magnetization orientation contacts a first side of the nonmagnetic region;
    forming a first region with a fixed magnetization orientation and a second region with a fixed magnetization orientation, such that the first region with a fixed magnetization orientation contacts a second side of the nonmagnetic region and the second region with a fixed magnetization orientation is adjacent to a third side of the nonmagnetic region, wherein none of the region with a free magnetization orientation, the first region with a fixed magnetization orientation, or the second region with a fixed magnetization orientation are touching;
    forming a top electrode over the transistor and forming the region with a free magnetization orientation over the top electrode; and
    forming a spacer region over the top electrode and depositing the region with a free magnetization orientation within an inner perimeter of the spacer region.

25. A method for forming a cell structure, the method comprising:
    forming a recess in a substrate;
    forming a transistor in the recess;
    forming a region with a free magnetization orientation in the recess and over the transistor;
    forming a nonmagnetic region over the region with a free magnetization orientation, such that the region with a free magnetization orientation contacts a first side of the nonmagnetic region;
    forming a first region with a fixed magnetization orientation and a second region with a fixed magnetization orientation, such that the first region with a fixed magnetization orientation contacts a second side of the nonmagnetic region and the second region with a fixed magnetization orientation is adjacent to a third side of the nonmagnetic region, wherein none of the region with a free magnetization orientation, the first region with a fixed magnetization orientation, or the second region with a fixed magnetization orientation are touching; and forming a switch to ground either the first region with a fixed magnetization orientation or the second region with a fixed magnetization orientation.

* * * * *

UNITED STATES PATENT AND TRADEMARK OFFICE
CERTIFICATE OF CORRECTION

| | | |
|---|---|---|
| PATENT NO. | : 8,553,451 B2 | Page 1 of 1 |
| APPLICATION NO. | : 13/168530 | |
| DATED | : October 8, 2013 | |
| INVENTOR(S) | : Jun Liu | |

It is certified that error appears in the above-identified patent and that said Letters Patent is hereby corrected as shown below:

On the Title page, in item (75), Inventors, in column 1, line 1, delete "Bose," and insert -- Boise, --, therefor.

Signed and Sealed this
Twenty-eighth Day of January, 2014

Michelle K. Lee
*Deputy Director of the United States Patent and Trademark Office*